United States Patent
Li et al.

(10) Patent No.: US 12,223,377 B2
(45) Date of Patent: Feb. 11, 2025

(54) METHODS FOR CONSTRUCTING, GENERATING, AND READING DOT-MATRIX CODE, DOT-MATRIX CODE GENERATING AND READING TERMINALS, AND DOT-MATRIX CODE SYSTEM

(71) Applicant: SHA Information Technology (Shanghai)Co., LTD., Shanghai (CN)

(72) Inventors: Ruoxi Li, Shanghai (CN); Bin Chen, Shanghai (CN)

(73) Assignee: SHA Information Technology (Shanghai)Co., LTD., Shanghai (CN)

( * ) Notice: Subject to any disclaimer, the term of this patent is extended or adjusted under 35 U.S.C. 154(b) by 0 days.

(21) Appl. No.: 18/273,040

(22) PCT Filed: Jan. 26, 2021

(86) PCT No.: PCT/CN2021/073774
§ 371 (c)(1),
(2) Date: Jul. 19, 2023

(87) PCT Pub. No.: WO2022/155983
PCT Pub. Date: Jul. 28, 2022

(65) Prior Publication Data
US 2024/0086670 A1     Mar. 14, 2024

(30) Foreign Application Priority Data
Jan. 20, 2021 (CN) .......................... 2021100770957

(51) Int. Cl.
*G06K 19/06*     (2006.01)
*H03M 13/15*    (2006.01)

(52) U.S. Cl.
CPC . *G06K 19/06037* (2013.01); *G06K 19/06075* (2013.01); *G06K 19/06103* (2013.01); *H03M 13/1515* (2013.01)

(58) Field of Classification Search
CPC ....... G06K 19/06037; G06K 19/06075; G06K 19/06103
(Continued)

(56) References Cited

U.S. PATENT DOCUMENTS 5,825,947 A * 10/1998 Sasaki .............. G06K 19/06037
                                                                    235/494
5,860,679 A *  1/1999 Fukuda ..................... G06K 7/14
                                                                    283/93
(Continued)

FOREIGN PATENT DOCUMENTS

CN     105894067 A     8/2016
CN     106874819 A     6/2017
(Continued)

*Primary Examiner* — Paultep Savusdiphol
(74) *Attorney, Agent, or Firm* — IPRTOP LLC (57) ABSTRACT

Methods for constructing, generating, and reading a dot-matrix code, dot-matrix code generating and reading terminals, and a dot-matrix code system. The method for constructing a dot-matrix code includes: constructing a plurality of information units arranged in an N×N matrix; configuring the plurality of information units as information unit modules and/or marker unit modules; storing, in each of the information unit modules, a value based on a relative position of the information point within the corresponding information unit module; signaling identification information of the dot-matrix code through an arrangement of a subset of the information points, wherein the subset of the information points are contained in the marker unit modules. The methods for constructing, generating, and reading a dot-matrix code, the dot-matrix code generating and reading terminals, and the dot-matrix code system of the present disclosure can provide uniformly distributed dot-matrix codes with information hiding features, satisfying practical needs.

15 Claims, 7 Drawing Sheets

(58) Field of Classification Search
USPC .......................................................... 235/494
See application file for complete search history.

(56) References Cited

U.S. PATENT DOCUMENTS

| | | | |
|---|---|---|---|
| 5,951,056 A * | 9/1999 | Fukuda | B42D 15/00 |
| | | | 283/93 |
| 8,325,063 B2 | 12/2012 | Dasgupta | |
| 10,410,104 B2 * | 9/2019 | Li | G06K 7/14 |
| 11,062,108 B2 * | 7/2021 | Bradley | G06K 7/1443 |
| 2003/0066896 A1 * | 4/2003 | Pettersson | G06K 7/10722 |
| | | | 235/494 |
| 2005/0145703 A1 * | 7/2005 | Bryborn | G06K 19/06037 |
| | | | 235/494 |
| 2005/0173533 A1 * | 8/2005 | Pettersson | G06K 19/06037 |
| | | | 235/494 |
| 2009/0078475 A1 * | 3/2009 | Ericson | G06K 19/06037 |
| | | | 178/18.03 |
| 2009/0207101 A1 * | 8/2009 | Noguchi | G06F 3/0321 |
| | | | 345/55 |
| 2009/0302114 A1 * | 12/2009 | Ao | G06K 19/06037 |
| | | | 235/494 |
| 2018/0341845 A1 * | 11/2018 | Li | G06K 7/14 |
| 2019/0332840 A1 * | 10/2019 | Sharma | G06K 7/1447 |

FOREIGN PATENT DOCUMENTS

| | | |
|---|---|---|
| CN | 110689100 A | 1/2020 |
| CN | 111832680 A | 10/2020 |

* cited by examiner

METHODS FOR CONSTRUCTING, GENERATING, AND READING DOT-MATRIX CODE, DOT-MATRIX CODE GENERATING AND READING TERMINALS, AND DOT-MATRIX CODE SYSTEM

FIELD OF THE INVENTION

The present disclosure generally relates to dot-matrices, and in particular to methods for constructing, generating, and reading a dot-matrix code, dot-matrix code terminals, and a dot-matrix code system.

BACKGROUND OF THE INVENTION

Barcode technology, as a mainstream information technology tool, is widely used in daily life. According to different ways of organizing information, barcodes can be divided into one-dimensional barcodes (1D barcodes) and two-dimensional barcodes (2D barcodes). 1D barcodes represent data by changing the width and spacing of parallel lines, and then represent more information by arranging combinations and spacing between these lines with different widths. When reading and recognizing 1D barcodes, there is a strong directional constraint, leading to the advantage of extremely fast information input and reading. Two-dimensional codes (2D codes) include "2D barcodes" and "2D matrix codes". 2D barcodes are vertical accumulation of 1D barcodes, expanding barcodes from 1D to 2D. Therefore, 2D barcodes can store more data per unit area, and meanwhile its information representation method and recognition direction are still compatible with those of 1D barcodes. In contrast, 2D matrix codes directly expand the barcodes to two dimensions through the organization of the matrix. Their information representation method is to represent "1" or "0" by whether a certain two-dimensional unit is colored and then to further represent data using two-dimensional symbols and shapes formed by colored two-dimensional units.

A wide variety of codes are used in different fields, bringing many conveniences to daily life. However, for some application areas, existing barcodes are not completely applicable. For example, most products currently have 1 D barcodes or 2D codes attached to their outer packaging. As an identification of the product, whether it is used for inventory management by manufacturers or for identification by users, 2D codes appear on almost every product packaging. But the problem is that the outer packaging of the product is not part of the product itself, which makes this kind of 2D-code identifiers separable from the product and leads to problems such as replacement, loss or tampering of the identifiers. Of course, it is also possible to print 2D codes directly on the product itself, but this affects the appearance of the product and too directly reveals the patterns, which contain information of the product.

For commonly used 2D codes, it is usually easy to quickly detect and depict them individually. This is because there are obvious markers in commonly used 2D codes to distinguish different modules in each 2D code for fast scanning. Moreover, due to how 2D codes represent information, there are large areas of continuous coloring in these codes, which not only affects the appearance of the product due to unevenly distributed coloring, but also makes it difficult to hide information represented by the 2D codes.

Therefore, there is a need to construct usable 2D codes that can achieve a certain degree of information hiding. The most widely used 2D code in the prior art is the Quick Response Code (QR code). It can be easily produced, quickly scanned, and hold a large amount of data. It can also be corrected for up to 30% errors, making it ideal for use in a variety of fields, including communication, medicine, retail, and payment. QR codes are so commonplace that they are often considered synonymous with 2D codes. QR codes have a large information capacity and strong error correction capability, which allows for a variety of information hiding and beautification methods.

(1) Hiding

In the field of digital image, the DCT embedding algorithm is used to embed a QR code image into a carrier image, and later the original QR code image will be extracted from the carrier image for recognition. This technology mainly uses digital images as carriers for QR code hiding, and it will be difficult for observers to identify the hidden information once the digital images are printed as physical images, and error correction capability of this technology also enables it to tolerate any pixel increase or decrease that occurs during the process. However, QR codes hidden using this kind of image watermarking are completely unrecognizable to the human eye, and are only applicable to digital images, not to optical images that are printed and then scanned.

(2) Beautification and Fusion

QR code beautification is based on the powerful error correction and positioning capabilities of QR codes, which can embed graphics in parts of a QR code, add patterns around it, add a background, and modify the overall color to beautify the QR code, and even integrate the QR code into dynamic images. Position detection patterns of the QR code allow for easy extracting of the QR code from the background and surrounding patterns. But these position detection patterns are too obvious, and therefore although the image is beautified, the information is not well hidden.

SUMMARY OF THE INVENTION

In view of the above-mentioned shortcomings of the prior art, the present disclosure provides methods for constructing, generating, and reading a dot-matrix code, dot-matrix code generating and reading terminals, and a dot-matrix code system that can provide uniformly distributed dot-matrix codes with information hiding features, satisfying practical needs.

To achieve the above purpose and other related purposes, the present disclosure provides a method for constructing a dot-matrix code, including: constructing information units arranged in an N×N matrix; configuring the information units as information unit modules and/or marker unit modules; storing, in each of the information unit modules, a value based on a relative position of the information point within the corresponding information unit module; and signaling identification information of the dot-matrix code through an arrangement of a subset of the information points, where the subset of the information points are contained in the marker unit modules.

In an embodiment of the present disclosure, the identification information of the dot-matrix code includes a dot-matrix orientation and dot-matrix boundaries.

In an embodiment of the present disclosure, of the information points, those located in upper left, lower left, upper right, or lower right portions of the information unit modules each represent a quaternary value.

In an embodiment of the present disclosure, of the information points that are located in the marker unit modules, those representing a top boundary, a bottom boundary, or vertices of the dot-matrix code are located in centers of the marker unit modules, and those representing a left boundary or a right boundary of the dot-matrix code (not including vertices) are alternately located in left or right portions of the marker unit modules.

In an embodiment of the present disclosure, of the information points that are located in the marker unit modules, those representing the boundaries of the dot-matrix code are located in centers of the marker unit modules, and those representing the vertices are located in upper left portions of the marker unit modules. The information unit located in the center of the whole dot-matrix code contains an information point located in the upper left corner of this information unit.

In an embodiment of the present disclosure, of the information points that are located in the marker unit modules, those representing the boundaries, not including vertices, of the dot-matrix code are located in centers of the marker unit modules, and those representing vertices are located in upper left portions of the marker unit modules.

In an embodiment of the present disclosure, corners of the dot-matrix code are indicated by those of the information points, that collectively form arcs or right angles.

The present disclosure provides a method for generating a dot-matrix code, including:
obtaining information to be embedded into the dot-matrix code;
obtaining configuration information of a dot-matrix code image corresponding to the dot-matrix code;
encrypting the information to be embedded to obtain encrypted information;
performing error correction coding on the encrypted information to obtain error-corrected information;
converting the error-corrected information into a dot-matrix code constructed based on the method for constructing a dot-matrix code mentioned above;
generating an image shading based on the configuration information of the dot-matrix code image; and
embedding the dot-matrix code on the image shading.

In an embodiment of the present disclosure, the error correction coding of the encrypted information is performed using a concatenated code including RS codes and convolutional codes in combination with interleaving technology.

In an embodiment of the present disclosure, converting the error-corrected information into the dot-matrix code includes:
converting a hexadecimal string encoded with error correction codes into a quaternary data stream; and
sequentially embedding the information to be embedded, into a dot-matrix code from top to bottom and from left to right to generate the dot-matrix code.

In an embodiment of the present disclosure, the configuration information of the dot-matrix code image includes, a width and height, shading information, and a decryption key of the dot-matrix code image.

In an embodiment of the present disclosure, the method for generating a dot-matrix code further includes printing the dot-matrix code on a surface of a material; the material includes one or more of paper, metal, glass, and plastic.

The present disclosure further provides a dot-matrix code generating terminal including: a processor and a memory;
the memory is configured to store a computer program;
the processor is for executing the computer program stored in the memory to cause the terminal to perform the method for generating a dot-matrix code.

The present disclosure further provides a dot-matrix code reading method, including:

obtaining an image including the dot-matrix code, the dot-matrix code being generated based on the method for generating a dot-matrix code;
identifying encoded information of the dot-matrix code based on the image, and obtaining a decoding key thereof;
correcting the encoded information of the dot-matrix code using error correction coding; and
when the correcting is successful, decoding corrected encoded information of the dot-matrix code using the decoding key to obtain embedded information corresponding to the dot-matrix code.

The present disclosure further provides a dot-matrix code reading terminal, including a processor and a memory;
wherein the memory is configured to store a computer program;
wherein the processor is used to execute the computer program stored in the memory to cause the terminal to perform the method for reading a dot-matrix code.

The present disclosure further provides a dot-matrix code system including the dot-matrix code generating terminal and the dot-matrix code reading terminal.

Therefore, the methods for constructing, generating, and reading dot-matrix code, the dot-matrix code generating and reading terminals, and the dot-matrix code system of the present disclosure have the following beneficial effects:

(1) They can construct uniformly distributed dot-matrix codes and achieve information hiding, thereby satisfying practical needs;

(2) The dot-matrix code of the present disclosure changes the way information is represented by 2D codes; specifically, it expands the range of information units and uses relative positions of information points in the information units to represent different information values stored in the information units. (b) Within the same information unit, there is one and only one information point, and these information points are relatively uniformly distributed within the dot-matrix code.

(3) The dot-matrix code of the present disclosure has no obvious position detection patterns or "markers", and its appearance is aesthetically pleasing without being obvious.

(4) The dot-matrix code of the present disclosure can be continuously replicated and cover a large surface of a commercial product, a building, or even a human body, and arrangement and coloring of the 2D codes can serve as a basis of the appearance of the product, which is more conducive to hiding and beautifying the 2D codes.

(5) The dot-matrix code of the present disclosure can be printed on surfaces of different materials, such as paper, plastic, ceramics, metal, etc., without blocking the background patterns, which also makes the product more aesthetically pleasing.

(6) The uniqueness, integrity and availability of the dot-matrix code are guaranteed, which provides it the features of anti-tampering and anti-copying.

DETAILED DESCRIPTION

The present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. It should be noted that the following embodiments and the features in the embodiments can be combined with each other if no conflict will result.

It should be noted that the drawings provided in this disclosure only illustrate the basic concept of the present disclosure in a schematic way, so the drawings only show the components closely related to the present disclosure. The drawings are not necessarily drawn according to the number, shape and size of the components in actual implementation; during the actual implementation, the type, quantity and proportion of each component can be changed as needed, and the components' layout may also be more complicated.

Figure 1:
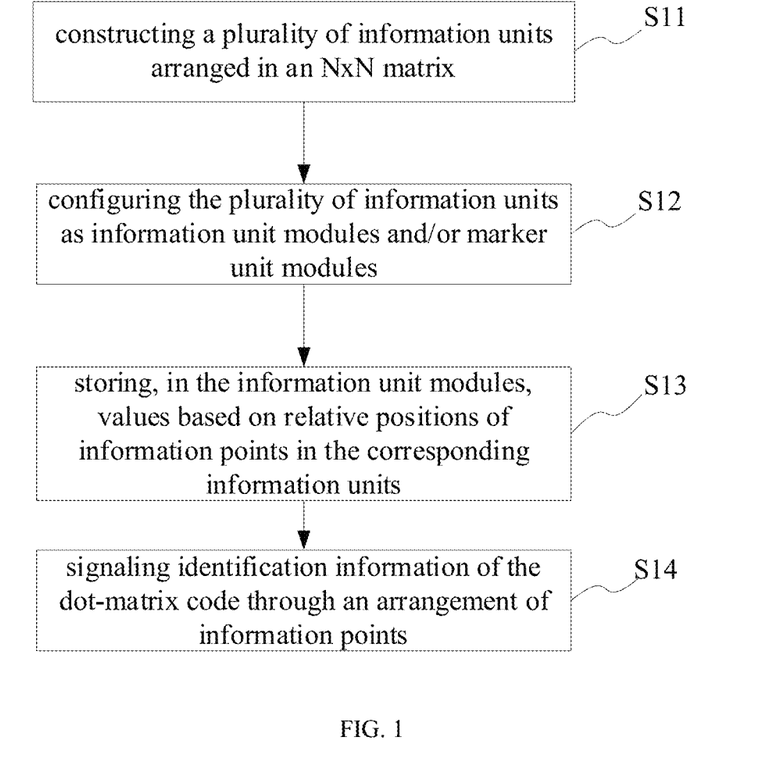
FIG. 1 shows a flow chart of a method for constructing a dot-matrix code according to one embodiment of the present disclosure.

The methods for constructing, generating, and reading dot-matrix code, the dot-matrix code terminals, and the dot-matrix code system of the present disclosure can construct uniformly distributed dot-matrix codes, achieve information hiding, and have advantages such as uniqueness, integrity, availability, anti-tampering, and anti-copying, thereby satisfying practical needs;

As shown in FIG. 1, in one embodiment, the method for constructing a dot-matrix code of the present disclosure includes:

Step S11, constructing information units arranged in an N×N matrix.

Specifically, the smallest unit in the dot-matrix code of the present disclosure is an information unit, and the N×N information units are uniformly distributed in a matrix. N is a natural number greater than or equal to 2. Each information unit consists of M×M pixels distributed in a matrix. M is a natural number greater than or equal to 2. Preferably, M is 2.

Step S12, configuring each individual information unit as an information unit module or a marker unit module.

Specifically, the information units in the dot-matrix code are divided into two main categories, namely, information unit modules and marker unit modules. The information unit modules are used to store information; the marker unit modules are used to represent identification information of the dot-matrix code.

Step S13, storing, in each of the information unit modules, a value based on a relative position of the information point within the corresponding information unit module.

Specifically, some information points are provided in the information unit modules and different values are represented by the information points according to positions of the information points within the information unit modules.

In an embodiment of the present disclosure, of the information points, those located in upper left, lower left, upper right, or lower right portions of the information unit modules each represent a quaternary value.

Step S14, signaling identification information of the dot-matrix code through an arrangement of a subset of the information points, wherein the subset of the information points is contained in the marker unit modules.

Specifically, some information points are provided in the marker unit modules to represent identification information of the dot-matrix code, such as a dot-matrix code orientation and dot-matrix code boundaries, based on how the information points are arranged, thereby enabling quick detection of individual dot-matrix codes among a plurality of consecutively formed dot-matrix codes, and thereby enabling reading information contained in each individual dot-matrix code. The dot-matrix code boundaries include the information units that are on the top, bottom, left and right boundaries.

Figure 2:
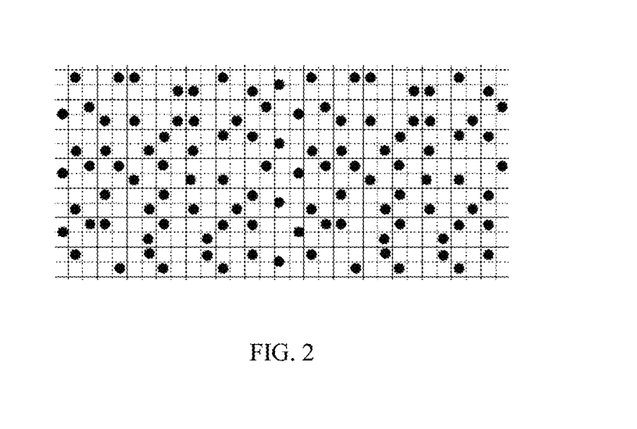
FIG. 2 shows a schematic diagram of uniformly distributed dot-matrix codes according to one embodiment of the present disclosure.
Figure 3:
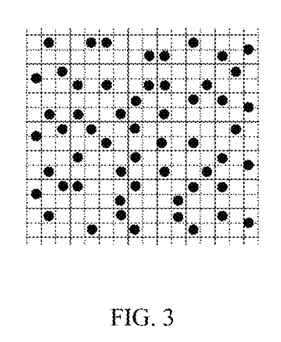
FIG. 3 shows a schematic diagram of uniformly distributed dot-matrix codes according to one embodiment of the present disclosure.

In the present disclosure, the marker unit modules can be arranged in various ways to meet the needs of different application scenarios. Preferably, as shown in FIGS. 2 and 3, the marker unit modules may be arranged in the following ways:

(1) of the information points that are located in the marker unit modules, those representing the top and bottom boundaries of the dot-matrix code have a different relative position from those representing the left and right boundaries of the dot-matrix code. As shown in FIG. 2, the information points representing the top and bottom boundaries (including the vertices) are located in centers of the corresponding information units, and the information points representing the left and right boundaries (not including the vertices) are alternately located in left or right portions of the corresponding information units. This arrangement allows the information points representing the top and bottom boundaries to be located on the same straight line and have a constant spacing; and the top and bottom boundaries are made up of these uniformly distributed information points. The left and right boundaries are perpendicular to the top and bottom boundaries, and their corresponding information points are alternately located on left and right portions of the corresponding information units. Since the dot-matrix code is a N×N matrix, the top, the bottom, the left, and the right boundaries are each composed of N information points, and the number of information points staggered around the center line of each sideway boundary (i.e., left or right boundary) can be used to determine the orientation of the dot-matrix code and the four boundaries, respectively. For example, the left boundary may have more information points than the right boundary, or vice versa; for example, the left portion of the left boundary may have more information points than the right portion of the left boundary, or vice versa.

(2) of the information points that are located in the marker unit modules, those representing the top, bottom, left, or right boundaries of the dot-matrix code have a same relative position within the corresponding information units; preferably, they are located in centers of the marker unit modules. As shown in FIG. 3, the information points indicating the top, bottom, left, and right boundaries of the dot-matrix code are located in the centers of the corresponding information units. In this way, the four boundaries are represented in a uniform manner, simplifying the spacing; and dot-matrix code, providing a mediocre hiding feature; however, the orientation of the dot-matrix code cannot be discerned from the boundaries. Therefore, it is necessary to further define an orientation marker of the dot-matrix code. Preferably, the information unit located in the center of the whole dot-matrix code unit contains an information point located in the upper left corner of this information unit.

(3) of the information points that are located in the marker unit modules, those representing the boundaries (not including vertices) of the dot-matrix code are located in centers of the marker unit modules, and those representing vertices are located in upper left portions of the marker unit modules. That is, the information points in the information units of the upper left, upper right, lower left, and lower right corners of the dot-matrix code are located in the upper left corners of the corresponding information units, thus realizing boundary identification of the dot-matrix code.

(4) Corners of the dot-matrix code are indicated by those of the information points that collectively form arcs or right angles, thereby determining the position and orientation of the dot-matrix code.

Comparison of the two types of arrangement is shown in Table 1.

TABLE 1

Characteristics of the two types of arrangement

| Type of Arrangement | Amount of stored information (bit) | Advantage |
|---|---|---|
| information points representing different boundaries having different relative positions within corresponding information units | $4^{(n-2)^2}$ | Higher concealability |
| information points representing different boundaries having the same relative position within corresponding information units | $4^{(n-2)^2-1}$ | Low recognition complexity |

Therefore, the method for constructing a dot-matrix code of the present disclosure has the following advantages:

1) Uniform distribution of information units. 2D codes in the related technology represent "0" and "1" by whether a pixel is colored, which is conducive to convenient and fast filling and reading of information, but prevents uniform distribution of information units. In the process of filling in information, it is inevitable that certain two neighboring information units are both colored or not colored, so it is naturally impossible to achieve "uniform" distribution of the information units. At the same time, in achieving uniform distribution, information must also be incorporated into the code, which means that there must be some differences between different information units. In light of this, the dot-matrix code of the present disclosure changes the way information is represented by conventional 2D codes; specifically, it expands the range of information units and uses relative positions of information points in the information units to represent different information values stored in the information units. Within the same information unit, there is one and only one information point, and these information points are relatively uniformly distributed within the dot-matrix code.

(2) No obvious position detection patterns or "markers" For 2D codes in the related technology, their "markers" for positioning and image correction are obviously different from their information units for information storage, and these distinctive "markers" aid in quick positioning of the 2D codes to achieve rapid identification, but they are too obvious, and are useless when it comes to identifying an individual 2D code unit from a sequence of continuously distributed 2D codes. Therefore, although the existence of these markers of commonly used 2D codes improves the efficiency of 2D code identification, they also make the 2D codes overly obvious, which is not conducive to the hiding and beautification of the 2D codes. The dot-matrix code of the present disclosure has no obvious position detection patterns or "markers", and its appearance is aesthetically pleasing without being obvious, in contrast to the commonly used 2D codes.

(3) The dot-matrix code can be continuously replicated and cover a large surface. The 2D codes in the related technology are often individually used, which although makes them easy to read, also prevents them from being well integrated into the appearance of the product. The dot-matrix code of the present disclosure can be continuously replicated over a large area; thus, arrangement and coloring of the codes can be an organic part of the appearance of the product directly, which is even better than rudimentary attempts to "integrate" the codes into the appearance of the product. Therefore, using the dot-matrix code of the present disclosure as a basis of the appearance of the product is more conducive to hiding and beautifying the 2D code.

Figure 4:
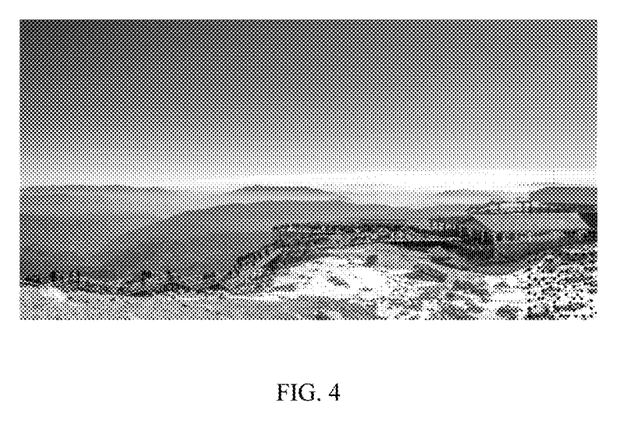
FIG. 4 shows a schematic diagram of uniformly distributed dot-matrix codes after beautification according to one embodiment of the present disclosure

(4) Hiding of information and beautification of appearance are achievable. As shown in FIG. 4, when there is a coloring pattern in the dot-matrix code, the pattern will become more obvious as the density of pixels increases, attracting more attention of an observer to the pattern. Due to the higher density of the pixels, the relative positions of the information points in the corresponding information units are less obvious, so that the observer will ignore the dot-matrix code while appreciating the pattern, significantly enhancing the concealment of the dot-matrix code. Meanwhile, adjusting the peripheral shape of the dot-matrix code will also help to hide the peripherals of the dot-matrix code, as well as beautifying the code.

(5) The dot-matrix code can be printed on surfaces of different materials, such as paper, plastic, ceramics, metal, etc. Conventional 2D codes can also be printed on surfaces of different materials, but they block the background patterns, and also make the product less aesthetically pleasing. The dot-matrix code of the present disclosure does not block the background patterns, which also makes the product more aesthetically pleasing.

(6) The dot-matrix code of the present disclosure can function like a "fingerprint" that can be carried around with a certain item, and thus can be highly helpful when keeping information of the item confidential and authenticating the item.

Figure 5:
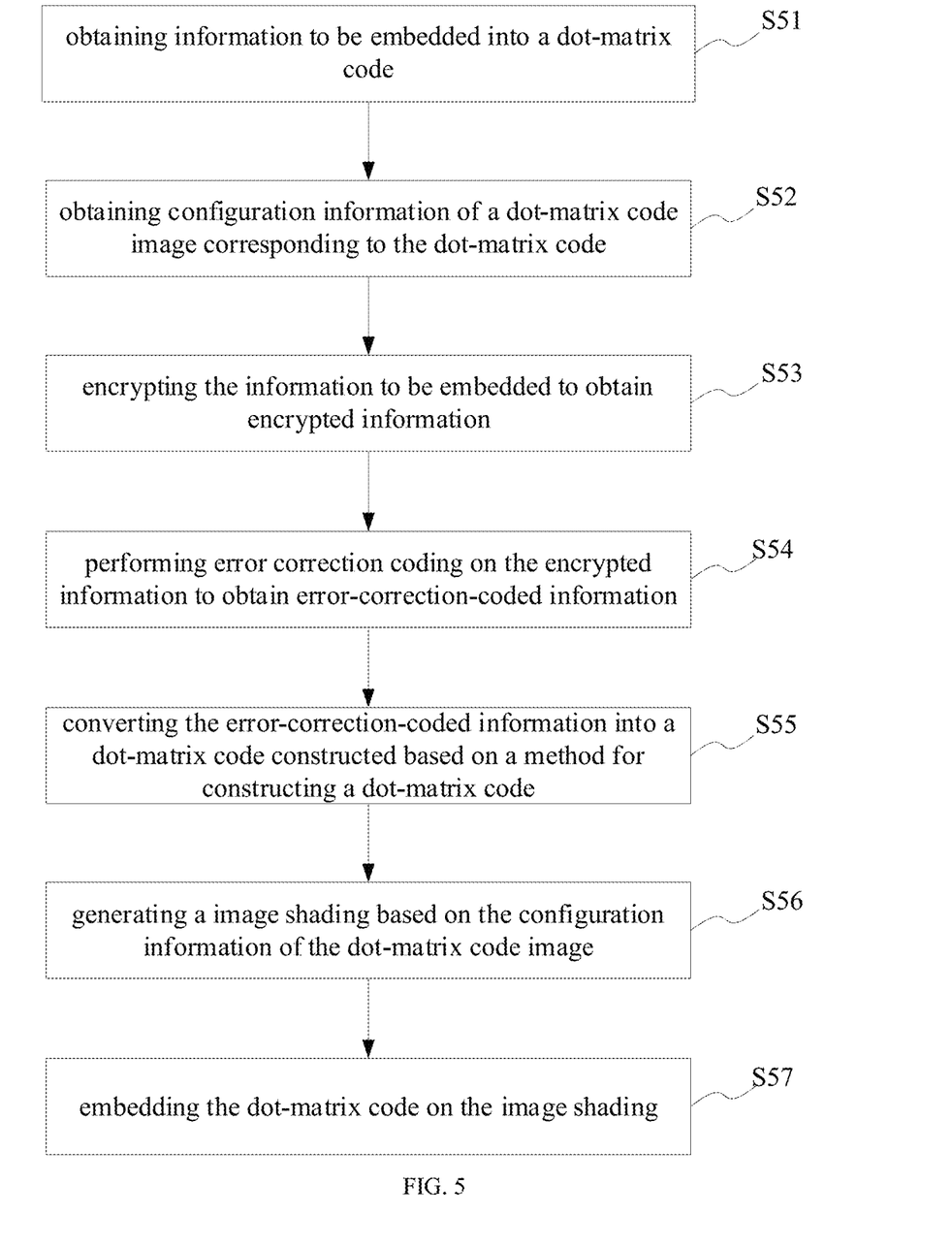
FIG. 5 shows a flowchart of a method for generating a dot-matrix code according to one embodiment of the present disclosure

As shown in FIG. 5, in one embodiment, the method for generating the dot-matrix code of the present disclosure includes:

Step S51, obtaining information to be embedded into the dot-matrix code;

Specifically, the information to be embedded can be text, numbers, URI, URL, etc. If the information to be embedded is numbers, it can be directly encoded.

An information decoding subsystem is provided to parse a data stream generated by an encoding subsystem so as to obtain the original information, and the process includes: identifying a dot-matrix code with uniformly distributed information points from a printing medium using a mobile device; identifying encoded information of the dot-matrix code and decoding key thereof based on the image obtained (the image carrying the dot-matrix code); correcting obtained data using error correction coding; and when the error correction fails, which means that there are a relatively large number of errors and re-identification should be performed, returning to the first step (i.e., identifying the dot-matrix codes); when the error correction succeeds, parsing the data that has been error corrected; and obtaining the original information embedded in the image.

Step S52, obtaining configuration information of the dot-matrix code image corresponding to the dot-matrix code.

Specifically, the configuration information of the dot-matrix code image includes a width and height, shading information, and a decryption key of the dot-matrix code image.

Step S53, encrypting the information to be embedded to obtain encrypted information;

Step S54, performing error correction coding on the encrypted information to obtain error-corrected information.

In an embodiment of the present disclosure, the error correction coding of the encrypted information is performed using a concatenated code including Reed-Solomon (RS) codes and convolutional codes in combination with interleaving technology. By encoding the encrypted information, and adding check bits and error correction bits, the error rate of the decoding process is reduced and the error tolerance of the information is improved.

Reed-Solomon coding is also called forward error correction coding, or channel coding, which was proposed by Irving S. Reed and Gustave Solomon in 1960 and has been widely used in the field of information storage and transmission. An RS coding system is divided into two parts: an encoder, which receives an original message and encodes it with additional parity check bit data, and a decoder, which processes encoded data and attempts to recover the original message.

RS codes are a special class of non-binary BCH codes with high error correction capability. For any chosen positive integer S, a corresponding code with a length n=qS−1 can be constructed as a q-ary BCH code, and q denotes a power of a prime number. When S=1, q>2, a q-ary BCH code of a length n=q−1 is created, which is the RS code. Take RS (n, k) as an example, k denotes the length of message symbols, and n denotes that n-k check symbols are added to the message symbols to form a coding sequence of total length n, i.e., the total codeword length. For this type of RS encoding, its decoder can correct at most t=(n−k)/2 errors. System coding is usually used to add check symbols, and system coding means adding check symbols directly after the original data information without altering the original information. When the length of the original message is s bits, the maximum codeword length for RS encoding is n=2s−1. Since operations of RS codes are based on univariate polynomials over a finite field, n should be less than or equal to 255 for a common 8-bit encoding. RS codes can cope with both random and bursty errors.

Convolutional codes were first introduced by Elias et al. in 1955. Unlike block codes, which encode information in separate blocks, convolutional codes encode continuous input sequences into continuous output sequences. In block codes, the n-k check elements in each group are only related to the k information elements in that group, and are independent of the information in other groups. However, in convolutional codes, when its encoder codifies k information code elements into n code elements, these n code elements are not only related to the k information code elements of the current segment, but also related to the information of the previous (m−1) segments (m is the constraint length of the code). Convolutional codes can be described using the notation (n, k, m), where k is the number of bits input to the convolutional encoder at a time, n is the number of bits in the output n-tuple codeword corresponding to each k-tuple codeword, and m is the coding memory, which is the number of k-tuples in the convolutional encoder, also known as the constraint length. Convolutional codes encode k-tuple input codewords into n-tuple output codewords, but k and n are usually small, making them particularly suitable for transmission in serial form with low delay. The error correction performance of convolutional codes increases with m, while the error rate decreases exponentially with N.

The error correction ability of convolutional codes is not only related to the constraint length, but also to the decoding method used. There are three commonly used decoding methods: algebraic decoding, Viterbi decoding, and sequential decoding. Viterbi decoding is an algorithm that finds the path on the code trellis with the minimum distance (or other measure) to the received sequence. It is similar to the shortest path algorithm used in operations research. Currently, the most widely used decoding algorithm is Viterbi decoding.

Interleaving coding is a communication technology that mitigates mobile communication signal fading in practical mobile communication environments. Fading in a practical mobile communication environment will cause bursty errors in digital signal transmission. Interleaving coding can be used to discrete and correct such bursty errors and improve the transmission characteristics of mobile communication. The purpose of interleaving coding is to discrete a long bursty error into random errors, and then use the coding technique for correcting random errors to eliminate the random errors. The larger the depth of interleaving, the greater the discretization, and the stronger the ability to resist bursty errors. However, the larger the depth of interleaving, the longer the processing time of interleaving coding, which increases the data transmission delay.

Step S55, the error-corrected information (i.e., the information to be embedded that has been encrypted and then error-corrected) is converted into a dot-matrix code constructed based on the above-mentioned method for constructing a dot-matrix code.

Specifically, converting the error-corrected information into the dot-matrix code includes:

(A) converting a hexadecimal string encoded with error correction codes into a quaternary data stream; and (B) sequentially embedding the information to be embedded, into a dot matrix from top to bottom and from left to right to generate the dot-matrix code. If there is a large amount of data stream, after embedding information in a single dot matrix, the embedding can move on to a next dot matrix in a random direction, as long as subsequent scanning is done sequentially according to the embedding sequence.

Step S56, generating an image shading based on the configuration information of the dot-matrix code image.

Step S57, embedding the dot-matrix code on the image shading.

In an embodiment of the present disclosure, the method for generating a dot-matrix code further includes printing the dot-matrix code on a surface of a material; wherein the material includes one or more of paper, metal, ceramics, and plastic.

Figure 6:
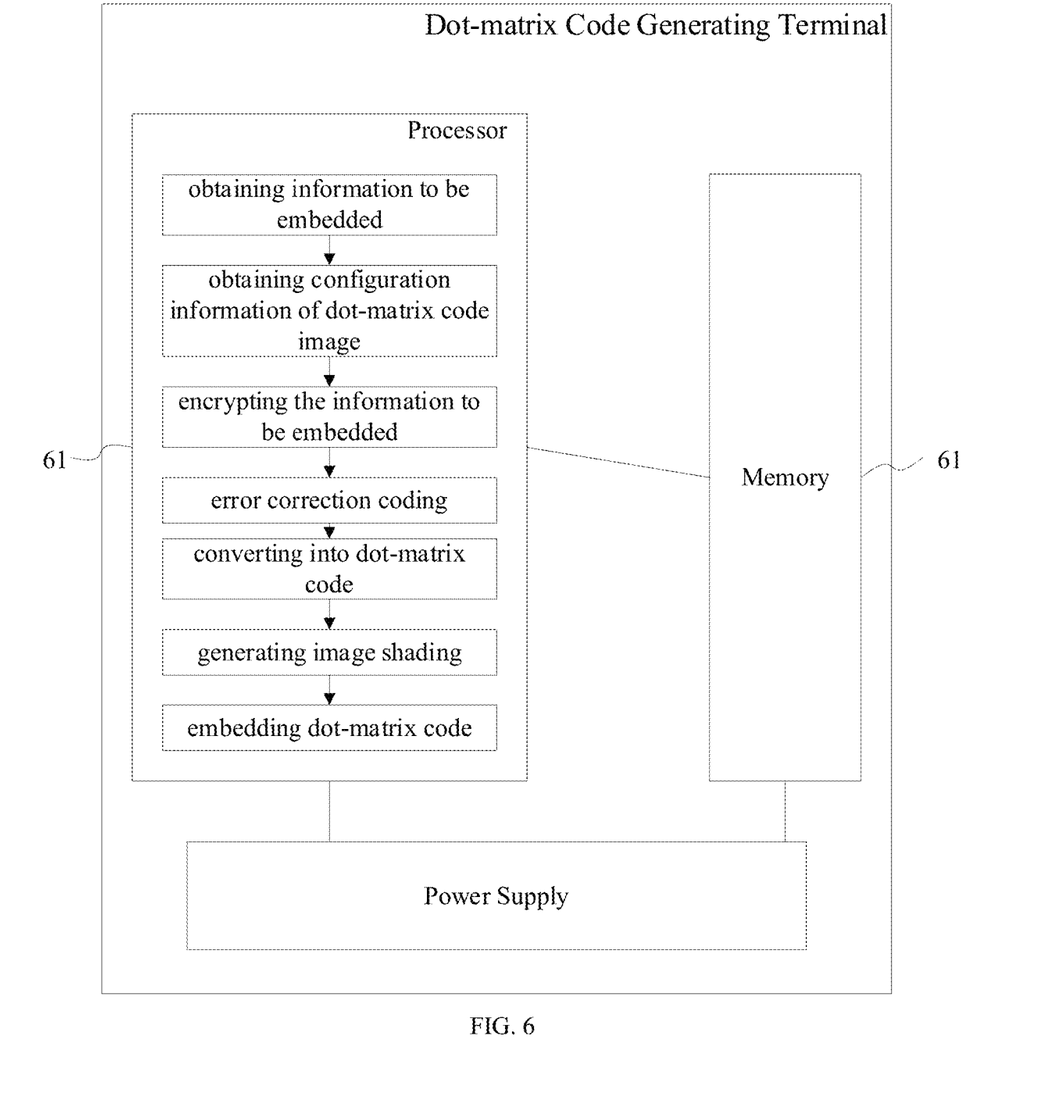
FIG. 6 shows a schematic structural diagram of a dot-matrix code generating terminal according to one embodiment of the present disclosure

As shown in FIG. 6, one embodiment of the present disclosure provides a dot-matrix code generating terminal, which includes a processor 61, and a memory 62.

The memory 62 is configured to store a computer program.

The memory 62 includes one or more of a ROM, RAM, magnetic disk, U disk, memory card, optical disk, or other medium that can store program codes.

The processor 61 is connected to the memory 62 for executing the computer program stored in the memory 62 to cause the terminal to perform the method for generating the dot-matrix code described above.

The processor 61 may be a general processor, including a Central Processing Unit (CPU), a Network Processor (NP), and the like. It may also be a Digital Signal Processor (DSP), an Application Specific Integrated Circuit (ASIC), a Field-Programmable Gate Array (FPGA), a Graphic Processing Unit (GPU), or other programmable logic devices, discrete gate or transistor logic devices, or discrete hardware components.

Figure 7:
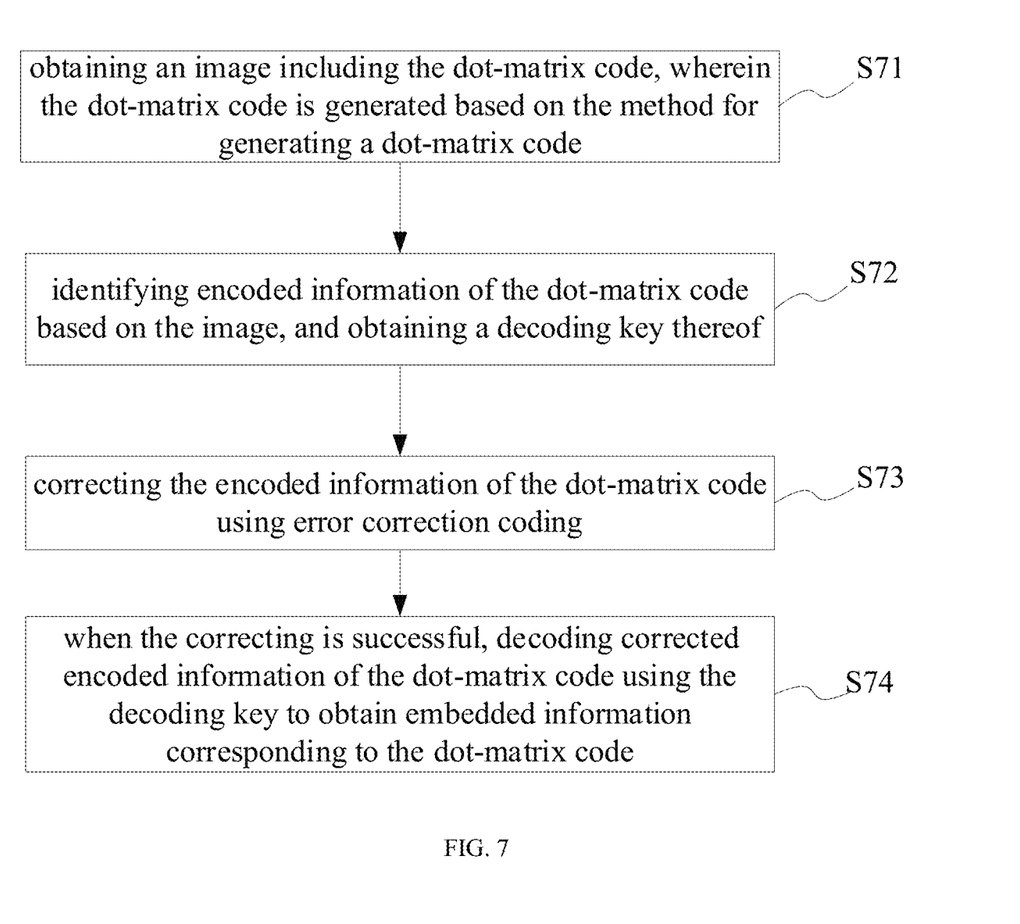
FIG. 7 shows a flowchart of a dot-matrix code reading method according to one embodiment of the present disclosure

As shown in FIG. 7, one embodiment of the present disclosure provides a method for reading a dot-matrix code, which includes the following steps.

Step S71, obtaining an image including the dot-matrix code, in which the dot-matrix code is generated based on the method for generating a dot-matrix code described above.

Step S72, identifying encoded information of the dot-matrix code based on the image, and obtaining a decoding key thereof;

Specifically, the decoding key is obtained from pre-obtained configuration information of the image.

Step S73, correcting the encoded information of the dot-matrix code using error correction coding; and Specifically, performing error correction on the encoded information of the dot-matrix code, and if the error correction is successful, transmitting the corrected data to a decoding module; when the error correction fails, it means that there are a relatively large number of errors and re-identification of the dot-matrix code should be performed. The error correction efficiency of the method can be as high as 25% due to the use of concatenated codes combined with interleaving technology. The error tolerance rate of the dot-matrix code of the present disclosure is higher compared to conventional 2D codes with the same information capacity.

Step S74: when the error correction is successful, decoding corrected encoded information of the dot-matrix code using the decoding key to obtain embedded information corresponding to the dot-matrix code.

The error correction code decoding unit module is mainly??

Figure 8:
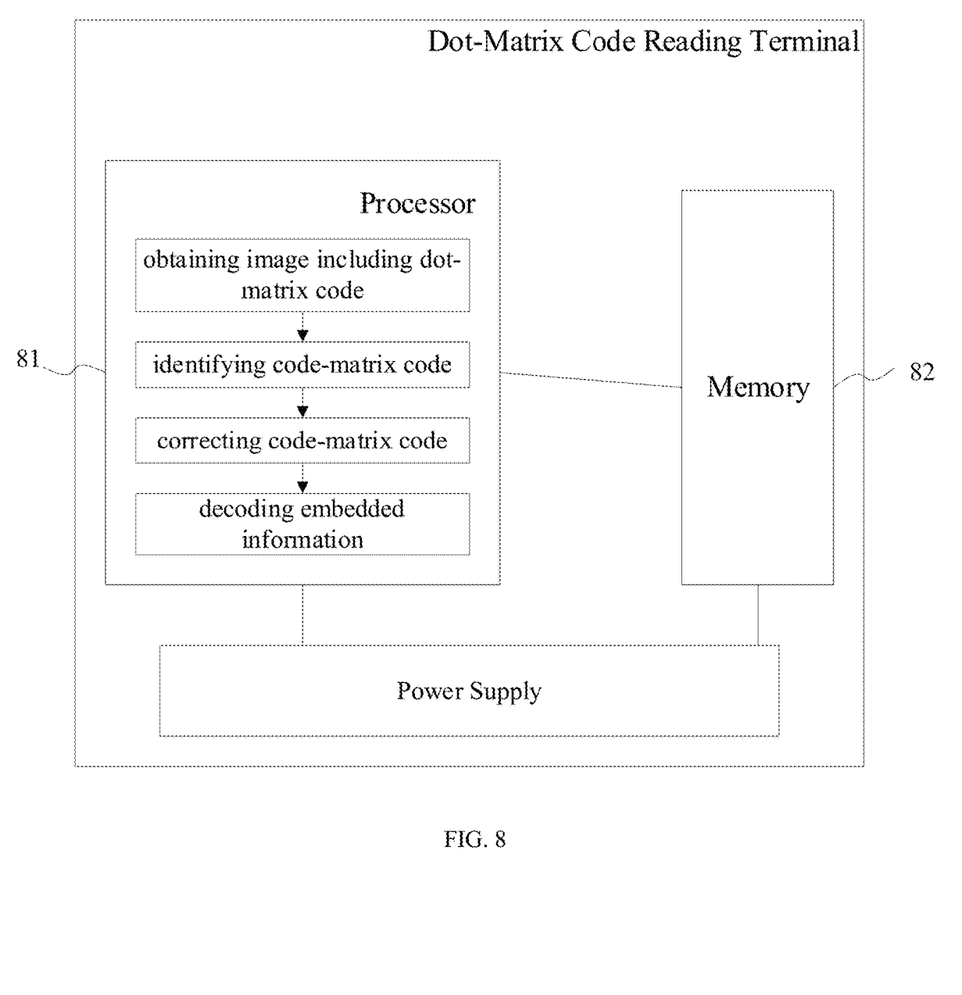
FIG. 8 shows a schematic structural diagram of a dot-matrix code reading terminal according to one embodiment of the present disclosure

As shown in FIG. 8, one embodiment of the present disclosure provides a dot-matrix code reading terminal, which includes a processor 81, and a memory 82.

The memory 82 is configured to store a computer program.

The memory 82 includes one or more of a ROM, RAM, magnetic disk, U disk, memory card, optical disk, or other medium that can store program codes.

The processor 81 is connected to the memory 82 for executing the computer program stored in the memory 82 to cause the terminal to perform the method for reading the dot-matrix code described above.

Figure 9:
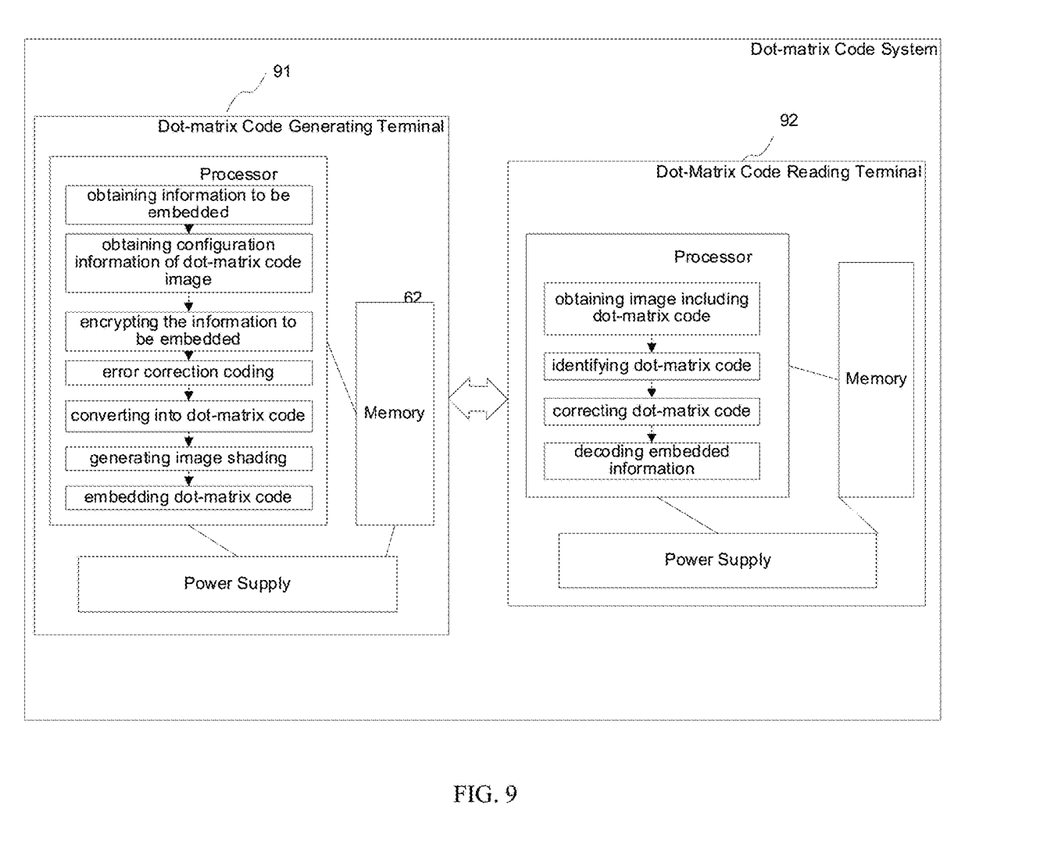
FIG. 9 shows a schematic structural diagram of a dot-matrix code system according to one embodiment of the present disclosure.

The processor 81 may be a general processor, including a Central Processing Unit (CPU), a Network Processor (NP), and the like. It may also be a Digital Signal Processor (DSP), an Application Specific Integrated Circuit (ASIC), a Field-Programmable Gate Array (FPGA), or other programmable logic devices, discrete gate or transistor logic devices, or discrete hardware components. As shown in FIG. 9, one embodiment of the present disclosure provides a dot-matrix code system, which includes the above-mentioned dot-matrix code generating terminal 91 and the above-mentioned dot-matrix code reading terminal 92, so as to realize the generation and reading of the dot-matrix code, as well as realizing the practical application of the dot-matrix code.

In summary, the methods for constructing, generating, and reading a dot-matrix code, the dot-matrix code generation and reading terminals, and the dot-matrix code system of the present disclosure can provide uniformly distributed dot-matrix codes with information hiding features, satisfying practical need. The dot-matrix code of the present disclosure changes the way information is represented by 2D codes; specifically, it expands the range of information units and uses relative positions of information points in the information units to represent different information values stored in the information units. Within the same information unit, there is one and only one information point, and information points are relatively uniformly distributed within the dot-matrix code. The dot-matrix code of the present disclosure has no obvious position detection patterns or "markers", and its appearance is aesthetically pleasing without being obvious. The dot-matrix code of the present disclosure can be continuously replicated and cover a large surface, and arrangement and coloring of the 2D codes can serve as a basis of the appearance of the product, which is more conducive to hiding and beautifying the 2D codes. The dot-matrix code of the present disclosure can be printed on surfaces of different materials, such as paper, plastic, ceramics, metal, etc., without blocking the background patterns, which also makes the product more aesthetically pleasing. The uniqueness, integrity and availability of the dot-matrix code are guaranteed, which provides it the features of anti-tampering and anti-copying. Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A method for constructing a dot-matrix code, comprising:
constructing a plurality of information units arranged in an N×N matrix;
configuring the plurality of information units as information unit modules and marker unit modules, respectively; wherein each information unit is either one of the information unit modules or one of the marker unit modules, and the dot-matrix code consists of the information unit modules and the marker unit modules, wherein each information unit contains one and only one information point;
storing, in each of the information unit modules, a value based on a relative position of the information point within the corresponding information unit module; and
signaling identification information of the dot-matrix code through an arrangement of a subset of the information points, wherein the subset of the information points are contained in the marker unit modules; wherein, of the information points that are located in the marker unit modules, those representing a top boundary, a bottom boundary, or vertices of the dot-matrix code are located in centers of the marker unit modules, and those representing a left boundary or a right boundary, not including vertices of the dot-matrix code, are alternately located in left or right portions of the marker unit modules.

2. The method for constructing the dot-matrix code according to claim 1, wherein the identification information of the dot-matrix code comprises a dot-matrix orientation and dot-matrix boundaries.

3. The method for constructing the dot-matrix code according to claim 1, wherein of the information points, those located in upper left, lower left, upper right, or lower right portions of the information unit modules each represent a quaternary value.

4. The method for constructing the dot-matrix code according to claim 1, wherein corners of the dot-matrix code are indicated by those of the information points, that collectively form arcs or right angles.

5. A method for generating a dot-matrix code, comprising:
obtaining information to be embedded into the dot-matrix code;
obtaining configuration information of a dot-matrix code image corresponding to the dot-matrix code;
encrypting the information to be embedded to obtain encrypted information;
performing error correction coding on the encrypted information to obtain error-corrected information;
converting the error-corrected information into a dot-matrix code constructed based on the method for constructing the dot-matrix code according to claim 1;
generating an image shading based on the configuration information of the dot-matrix code image; and
embedding the dot-matrix code on the image shading.

6. The method for generating the dot-matrix code according to claim 5, wherein the error correction coding of the encrypted information is performed using a concatenated code comprising RS codes and convolutional codes in combination with interleaving technology.

7. The method for generating the dot-matrix code according to claim 5, wherein converting the error-corrected information into the dot-matrix code comprises:
converting a hexadecimal string encoded with error correction codes into a quaternary data stream; and
sequentially embedding the information to be embedded, into a dot matrix from top to bottom and from left to right to generate the dot-matrix code.

8. The method for generating the dot-matrix code according to claim 5, wherein the configuration information of the dot-matrix code image comprises: a width and height, background information, and a decryption key of the dot-matrix code image.

9. The method for generating the dot-matrix code according to claim 5, further comprising printing the dot-matrix code on a surface of a material; wherein the material comprises one or more of paper, metal, and plastic.

10. A dot-matrix code generating terminal, comprising a processor and a memory;
wherein the memory is configured to store a computer program;
wherein the processor is for executing the computer program stored in the memory to cause the terminal to perform the method for generating the dot-matrix code of claim 5.

11. A method for reading a dot-matrix code, comprising:
obtaining an image comprising the dot-matrix code, wherein the dot-matrix code is generated based on the method for generating the dot-matrix code of claim 5;
identifying encoded information of the dot-matrix code based on the image, and obtaining a decoding key thereof;
correcting the encoded information of the dot-matrix code using error correction coding; and
when the correcting is successful, decoding corrected encoded information of the dot-matrix code using the decoding key to obtain embedded information corresponding to the dot-matrix code.

12. A dot-matrix code reading terminal, comprising a processor and a memory;
wherein the memory is configured to store a computer program;
wherein the processor is used to execute the computer program stored in the memory to cause the terminal to perform the method for reading the dot-matrix code of claim 11.

13. A dot-matrix code system, comprising a dot-matrix code generating terminal and a dot-matrix code reading terminal;
wherein each of the dot-matrix code generating terminal and the dot-matrix code reading terminal comprise a memory configured to store a computer program, and a processor for executing the computer program stored in the memory to cause to respectively cause:
the dot-matrix code generating terminal to perform the method for generating the dot-matrix code of claim 5,
the dot-matrix code reading terminal to perform a method for reading the dot-matrix code, comprising:
obtaining an image comprising the dot-matrix code, wherein the dot-matrix code is generated based on the method for generating the dot-matrix code;
identifying encoded information of the dot-matrix code based on the image, and obtaining a decoding key thereof;
correcting the encoded information of the dot-matrix code using error correction coding; and
when the correcting is successful, decoding corrected encoded information of the dot-matrix code using the decoding key to obtain embedded information corresponding to the dot-matrix code.

14. A method for constructing a dot-matrix code, comprising:
- constructing a plurality of information units arranged in an N×N matrix;
- configuring the plurality of information units as information unit modules and/or marker unit modules, respectively; wherein each information unit is either one of the information unit modules or one of the marker unit modules, and the dot-matrix code consists of the information unit modules and the marker unit modules, wherein each information unit contains one and only one information point;
- storing, in each of the information unit modules, a value based on a relative position of the information point within the corresponding information unit module; and
- signaling identification information of the dot-matrix code through an arrangement of a subset of the information points, wherein the subset of the information points are contained in the marker unit modules; wherein, of the information points that are located in the marker unit modules, those representing the top boundary, the bottom boundary, the left boundary, or the right boundary of the dot-matrix code are located in centers of the marker unit modules, and a central marker unit module located in the center of the entire dot-matrix code contains an information point located in the upper left portion of the central marker unit module.

15. A method for constructing a dot-matrix code, comprising:
- constructing a plurality of information units arranged in an N×N matrix;
- configuring the plurality of information units as information unit modules and/or marker unit modules, respectively; wherein each information unit is either one of the information unit modules or one of the marker unit modules, and the dot-matrix code consists of the information unit modules and the marker unit modules, wherein each information unit contains one and only one information point;
- storing, in each of the information unit modules, a value based on a relative position of the information point within the corresponding information unit module; and
- signaling identification information of the dot-matrix code through an arrangement of a subset of the information points, wherein the subset of the information points are contained in the marker unit modules; wherein, of the information points that are located in the marker unit modules, those representing boundaries, not including vertices, of the dot-matrix code are located in centers of the marker unit modules, and those representing four vertices of the dot-matrix code are located in upper left portions of the marker unit modules.

* * * * *